United States Patent
Choi et al.

(10) Patent No.: US 11,552,267 B2
(45) Date of Patent: Jan. 10, 2023

(54) SOFT MEMRISTOR FOR SOFT NEUROMORPHIC SYSTEM

(71) Applicant: KOREA ADVANCED INSTITUTE OF SCIENCE AND TECHNOLOGY, Daejeon (KR)

(72) Inventors: Sung-Yool Choi, Daejeon (KR); Byung Chul Jang, Daejeon (KR); Jun Hwe Cha, Daejoen (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 117 days.

(21) Appl. No.: 16/941,891

(22) Filed: Jul. 29, 2020

(65) Prior Publication Data
US 2021/0143349 A1    May 13, 2021

(30) Foreign Application Priority Data
Nov. 11, 2019 (KR) .................. 10-2019-0143130

(51) Int. Cl.
H01L 51/10 (2006.01)
H01L 27/28 (2006.01)
H01L 51/00 (2006.01)
G06N 3/063 (2006.01)
H01L 51/05 (2006.01)

(52) U.S. Cl.
CPC .......... *H01L 51/105* (2013.01); *G06N 3/063* (2013.01); *H01L 27/285* (2013.01); *H01L 51/0097* (2013.01); *H01L 51/0591* (2013.01); *H01L 51/004* (2013.01); *H01L 51/0094* (2013.01); *H01L 2251/301* (2013.01)

(58) Field of Classification Search
CPC . H01L 51/105; H01L 27/285; H01L 51/0097; H01L 51/0591
See application file for complete search history.

(56) References Cited

U.S. PATENT DOCUMENTS

| | | | | |
|---|---|---|---|---|
| 2015/0154469 A1* | 6/2015 | Park | ...... | G06N 3/049 706/18 |
| 2019/0355787 A1* | 11/2019 | Choi | ...... | H01L 45/146 |
| 2020/0335693 A1* | 10/2020 | Lee | ...... | H01L 45/1253 |

FOREIGN PATENT DOCUMENTS

| | | |
|---|---|---|
| JP | 2014-195111 | 10/2014 |
| KR | 10-1521383 | 5/2015 |
| KR | 10-1588980 | 1/2016 |
| KR | 10-2016-0063908 | 6/2016 |
| KR | 10-2018-0072259 | 6/2018 |

OTHER PUBLICATIONS

Office Action dated Sep. 18, 2020 corresponding to Korean Patent Application No. 10-2019-0143130, 4 pages.
Office Action dated Apr. 26, 2021 corresponding to Korean Patent Application No. 10-2019-0143130, 5 pages.

* cited by examiner

*Primary Examiner* — Anthony Ho

(57) ABSTRACT

The present disclosure provides a soft memristor for soft neuromorphic system including a substrate, a first electrode layer formed on the substrate, a metal diffusion barrier layer formed on the first electrode layer, a resistive switching material layer formed on the metal diffusion barrier layer, and a second electrode layer formed on the resistive switching material layer.

20 Claims, 4 Drawing Sheets

(a)

(b)

(a)

(b)

< Prior Art >

(a)  (b)

< Prior Art >

(a)   (b)

(a)　　　　　　　　　　(b)

(c)

SOFT MEMRISTOR FOR SOFT NEUROMORPHIC SYSTEM

CROSS-REFERENCE TO RELATED APPLICATION

This application claims priority of Korean Patent Application No. 10-2019-0143130, filed on Nov. 11, 2019, in the KIPO (Korean Intellectual Property Office), the disclosure of which is incorporated herein entirely by reference.

BACKGROUND OF THE INVENTION

Field of the Invention

The present disclosure relates to a soft memristor for a soft neuromorphic system.

Description of the Related Art

At present, new high-technology products capable of performing intelligent tasks such as self-driving, real-time analysis and language translation are appearing with the rapid development of software-based artificial intelligence technologies. In order to provide such artificial intelligence services to users more conveniently, intelligent soft electronic devices capable of providing user-friendly interfaces and convenient portability at the same time can be a good platform. Since the soft electronic devices should receive power supply from small batteries in the form of mobile electronic devices, it is essential to embody a neuromorphic system on a soft platform with low power consumption. However, the existing software-based artificial neural network normally utilizes a GPU-based cloud server in a von Neumann architecture wherein memory and processors are separated, leading to high power consumption. For vector matrix multiplication essential for embodying the artificial neural network, thereby, the conventional architecture is not suitable for a soft electronic system due to inefficient energy consumption. Besides, as use of cloud servers show problems such as quite long latency and security issues, a new approach is necessary for implementation of an artificial neural network directly on edge computing devices.

A memristor, which is a portmanteau of memory and resistor, is a two-terminal device where the resistance state is changed in response to electrical stimulation such as voltage or current. Due to a simple metal-resistive switching layer-metal (MIM) structure and its non-volatile characteristic, it has been greatly studied for practical application to high density memory on a soft platform, enabling a soft memristor system. In addition, the memristor can imitate synapses of the brain by realizing memory and computation functions at the same time. In addition, a crossbar array of memristors can effectively implement vector matrix multiplication through Ohm's law and Kirchhoff's law. In particular, a filament-type memristor operated by conductive atomic filaments is suitable in developing high density of memristor based synaptic devices for a neuromorphic system mimicking the brain.

However, although analog switching whereby the resistance value is changed gradually is necessary to apply the filament-type memristor as a synapse device, most of filament-type memristors composed of single resistive switching layers are driven by digital switching whereby the resistance value is changed abruptly.

FIG. 2 illustrates the digital and analog switching of a memristor depending on filament sizes.

As shown in FIG. 2(a), if thick filaments are formed inside a memristor device, digital switching occurs because the filaments are broken abruptly due to the heat generated by Joule heating.

In contrast, if thin filaments are formed as shown in FIG. 2(b), analog switching occurs as the heat generated by Joule heating is dissipated toward a bottom electrode and, at the same time, the tip of the filaments is thinned gradually due to electrochemical reactions.

Therefore, development of a new memristor structure is necessary to allow for analog switching of the filament-type memristor. In addition, as shown in FIG. 3, development of a new device structure capable of improving the recognition rate of a neuromorphic system by improving the symmetric synaptic characteristics whereby abrupt formation or breakage of the filaments formed inside the memristor occurs in response to a pulse voltage applied for synaptic potentiation and depression into symmetric synaptic characteristics is necessary.

SUMMARY OF THE INVENTION

A method for manufacturing a synapse device allowing analog switching through fine control of the filament size of a memristor and having symmetric synaptic characteristics is required.

In an exemplary embodiment, the present disclosure provides a soft memristor for a soft neuromorphic system.

The soft memristor for a soft neuromorphic system may include: a substrate; a first electrode layer formed on the substrate; a metal diffusion barrier layer formed on the first electrode layer; a resistive switching material layer formed on the metal diffusion barrier layer; and a second electrode layer formed on the resistive switching material layer.

The technical solution descried above does not describe all the features of the present disclosure. The various features of the present disclosure and the advantages and effects thereof arising therefrom will be understood in detail referring to the following exemplary embodiments.

According to an exemplary embodiment of the present disclosure, a synapse device allowing analog switching through fine control of the filament size of a memristor and having symmetric synaptic characteristics can be manufactured.

Through this, a basis for an intelligent soft electronic system that can conveniently provide artificial intelligence service to users may be provided.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
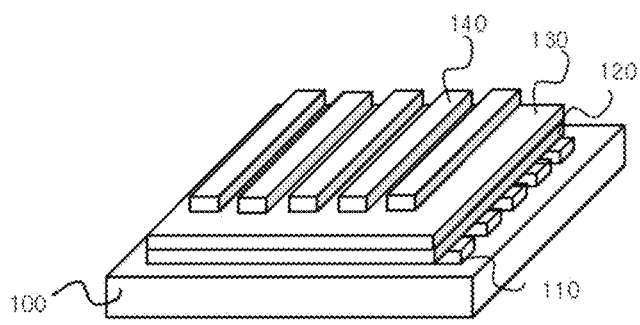
FIG. 1 shows the structure of a soft memristor according to an exemplary embodiment of the present disclosure.
Figure 1:
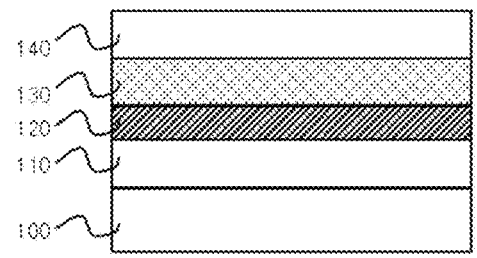
Figure 2:
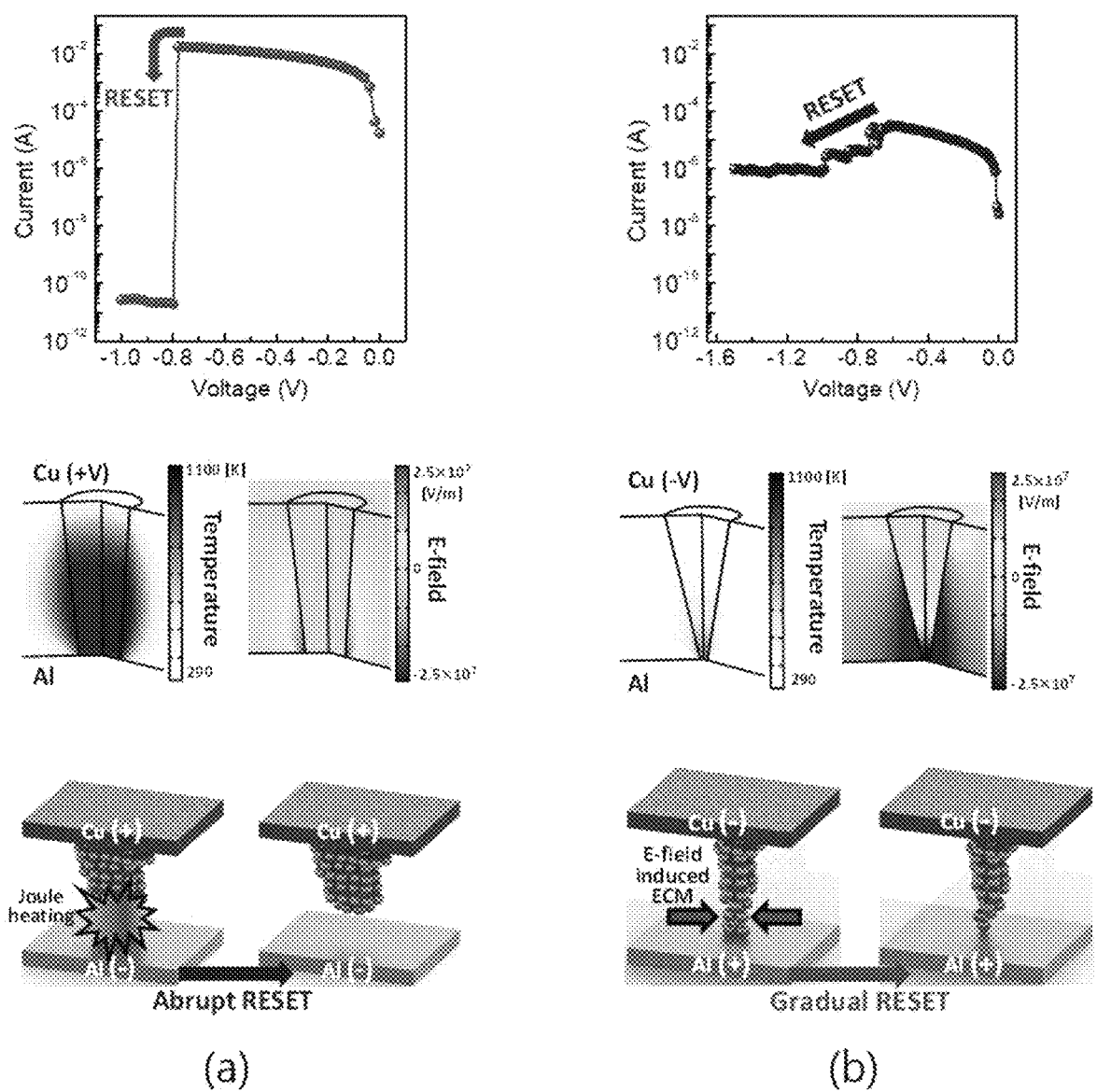
FIG. 2 shows images for illustrating digital and analog switching of a memristor depending on filament size.
Figure 3:
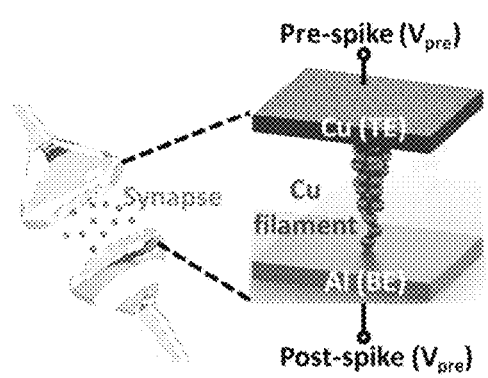
FIG. 3 shows asymmetric synaptic characteristics in response to a pulse voltage for synaptic potentiation and depression.
Figure 3:
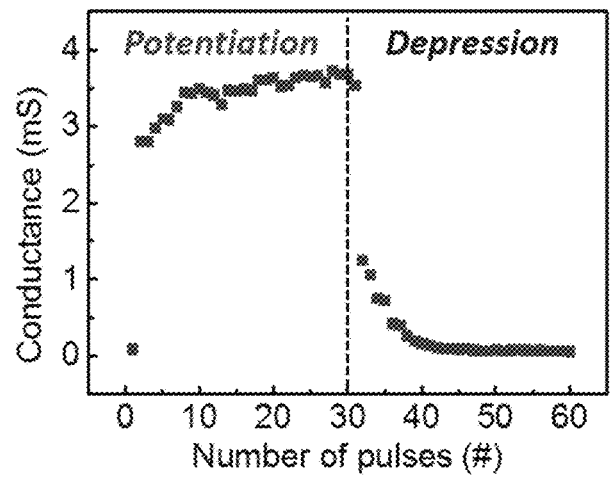

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

According to an embodiment of the present disclosure, dibenzyltoluene (DBT) is suggested as a compound for dehydrogenation of liquid organic hydrogen carriers (LOHC), but the scope of the present disclosure is not limited thereto. Any compounds for liquid organic hydrogen carriers capable of binding/release of hydrogen are also included in the scope of the present disclosure.

FIG. 1 shows the structure of a soft memristor according to an exemplary embodiment of the present disclosure.

Referring to FIG. 1, the soft memristor according to an exemplary embodiment of the present disclosure may be configured by including a substrate 100, a first electrode layer 110 formed on the substrate 100, a metal diffusion barrier layer 120 formed on the first electrode layer 110, a resistive switching material layer 130 formed on the metal diffusion barrier layer 120, and a second electrode layer 140 formed on the resistive switching material layer 130.

Here, the substrate 100 may be a substrate having flexible property, formed of at least one material selected from a group consisting of PMMA, PC, PES, PAR, PI, PET, PEN and PEEK.

The first electrode layer 110 and the second electrode layer 140 may be formed of at least one selected from a group consisting of Cu, Ni, Ti, Hf, Zr, ZN, W, Co, V, Al and Pt.

In an exemplary embodiment, each of the first electrode layer 110 and the second electrode layer 140 may be formed as a plurality of bars. A plurality of bars forming the first electrode layer 110 and a plurality of bars forming the second electrode layer 140 may cross each other perpendicularly to form crossbars.

The metal diffusion barrier layer 120 may be formed of any one selected from $Si_2N_3$, TiN and graphene, and does not affect the operation of a resistive switching memory.

According to an exemplary embodiment of the present disclosure, by introducing the metal diffusion barrier layer 120, the size of metal filaments formed inside the filament-type soft memristor may be controlled. That is to say, thin filaments may be formed due to the metal diffusion barrier layer 120 and, accordingly, analog switching of the soft memristor may be achieved. In addition, biological synaptic potentiation-depression and spike-timing-dependent plasticity (STDP), which are essential in learning or training process, can be mimicked.

Figure 4:
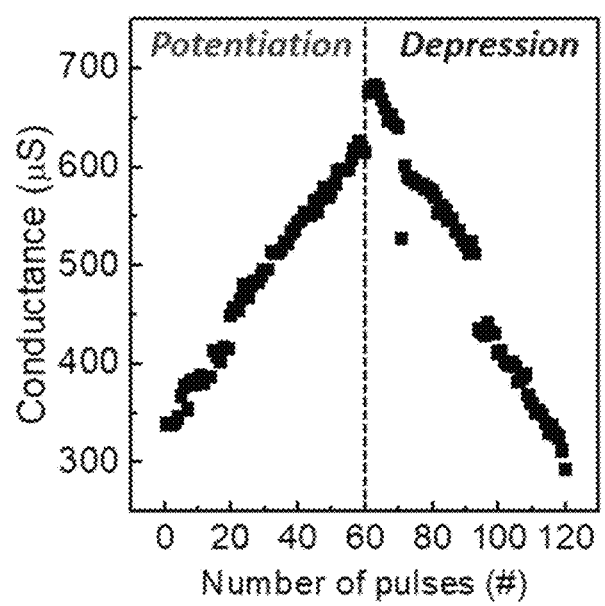
FIG. 4 shows symmetric synaptic characteristics in response to a voltage applied to a synapse device formed of a soft memristor according to an exemplary embodiment of the present disclosure.

Furthermore, the introduction of the metal diffusion barrier layer 120 allows application of a gradually decreasing voltage to the soft memristor by acting as voltage divider and, thus, can improve the asymmetric synaptic characteristics occurring in response to the same pulse voltage applied to the memristor for synaptic potentiation and depression into symmetric synaptic characteristics, as shown in FIG. 4. The introduction of identical pulses can save the necessity of the complexity and large area of peripheral circuits for memristors to achieve a gradual increase or decrease in voltage to the memristor in order to realize symmetric synaptic characteristics.

The resistive switching material layer 130 may be formed of a polymer-deposited insulating film, and the deposited polymer may be any one selected from a group consisting of poly(cyclosiloxane), poly(FMA), poly(IBC), poly (EGDMA) and poly(V3D3).

Figure 5:
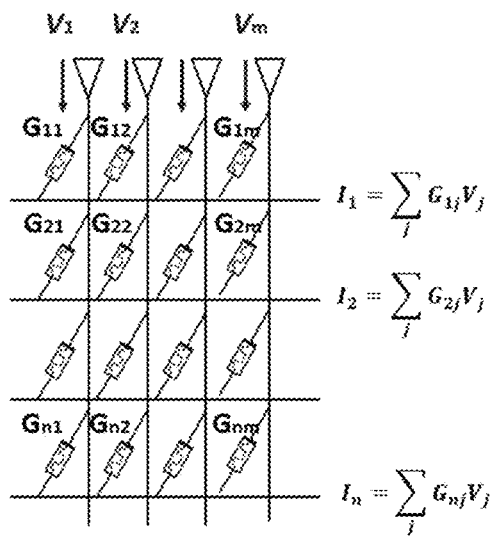
FIG. 5 illustrates vector matrix multiplication of a soft memristor according to an exemplary embodiment of the present disclosure crossbar array.

FIG. 5 illustrates vector matrix multiplication of a soft memristor according to an exemplary embodiment of the present disclosure crossbar array.

Figure 6:
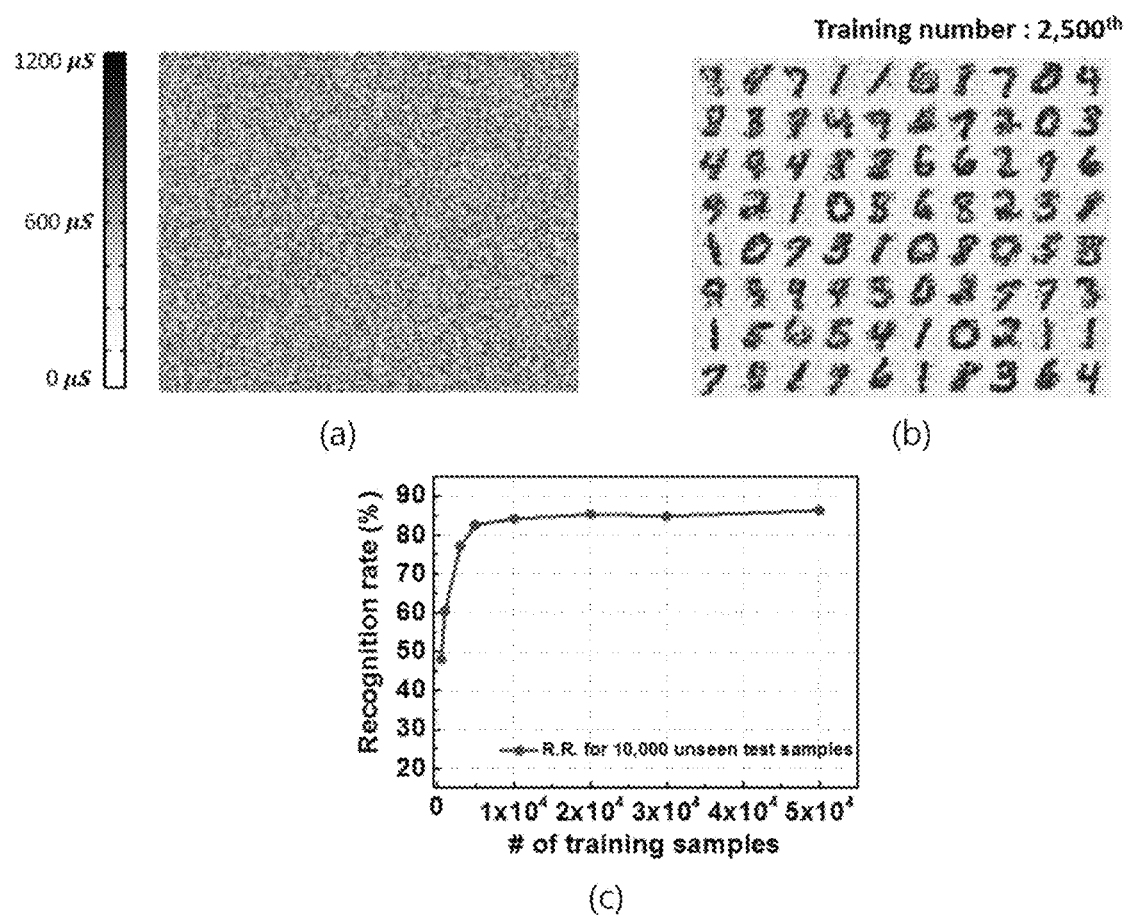
FIG. 6 shows a result of MNIST handwritten digit recognition by an artificial neural network formed of a soft memristor according to an exemplary embodiment of the present disclosure.

FIG. 6 shows a result of MNIST handwritten digit recognition by an artificial neural network formed of a soft memristor according to an exemplary embodiment of the present disclosure. FIG. 6(a) shows the conductivity distribution of a synapse device before learning, and FIG. 6(b) shows the conductivity distribution of a synapse device after learning. And, FIG. 6(c) shows recognition rate.

The synapse device described above may be used to configure a neuromorphic system, which allows low-power and high-recognition-rate processing of unstructured data such as characters, images, voice, etc.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A soft memristor comprising:
a substrate;
a first electrode layer formed on the substrate;
a metal diffusion barrier layer formed on the first electrode layer;
a resistive switching material layer formed on the metal diffusion barrier layer; and
a second electrode layer formed on the resistive switching material layer,
wherein the metal diffusion barrier layer is formed of any one selected from the group consisting of $Si_2N_3$, TiN, and graphene.

2. The soft memristor of claim 1, wherein the size of metal filaments formed in a filament-type soft memristor is controlled by the metal diffusion barrier layer.

3. The soft memristor of claim 1, wherein the soft memristor has symmetric synaptic characteristics in response to a pulse voltage applied for synaptic potentiation and depression due to the metal diffusion barrier layer as a voltage divider.

4. The soft memristor of claim 1, wherein the first electrode layer is formed of a material selected from the group consisting of Cu, Ni, Ti, Hf, Zr, ZN, W, Co, V, Al, and Pt.

5. The soft memristor of claim 1, wherein the second electrode layer is formed of a material selected from the group consisting of Cu, Ni, Ti, Hf, Zr, ZN, W, Co, V, Al, and Pt.

6. The soft memristor of claim 1, wherein each of the first electrode layer and the second electrode layer is formed as a plurality of bars.

7. The soft memristor of claim 6, wherein a plurality of bars forming the first electrode layer and a plurality of bars forming the second electrode layer cross each other perpendicularly.

8. A soft memristor comprising:
a substrate;
a first electrode layer formed on the substrate;
a metal diffusion barrier layer formed on the first electrode layer;
a resistive switching material layer formed on the metal diffusion barrier layer; and
a second electrode layer formed on the resistive switching material layer,
wherein the resistive switching material layer is formed of a polymer-deposited insulating film.

9. The soft memristor of claim 8, wherein the polymer-deposited insulating film is formed of any one selected from the group consisting of poly(cyclosiloxane), poly(FMA), poly(IBC), poly(EGDMA), and poly(V3D3).

10. The soft memristor of claim 8, wherein the size of metal filaments formed in a filament-type soft memristor is controlled by the metal diffusion barrier layer.

11. The soft memristor of claim 8, wherein the soft memristor has symmetric synaptic characteristics in response to a pulse voltage applied for synaptic potentiation and depression due to the metal diffusion barrier layer as a voltage divider.

12. The soft memristor of claim 8, wherein the first electrode layer is formed of a material selected from the group consisting of Cu, Ni, Ti, Hf, Zr, ZN, W, Co, V, Al, and Pt.

13. The soft memristor of claim 8, wherein the second electrode layer is formed of a material selected from the group consisting of Cu, Ni, Ti, Hf, Zr, ZN, W, Co, V, Al, and Pt.

14. The soft memristor of claim 8, wherein each of the first electrode layer and the second electrode layer is formed as a plurality of bars.

15. A soft memristor comprising:
a substrate;
a first electrode layer formed on the substrate;
a metal diffusion barrier layer formed on the first electrode layer;
a resistive switching material layer formed on the metal diffusion barrier layer; and
a second electrode layer formed on the resistive switching material layer,
wherein the substrate is formed of a material selected from the group consisting of PMMA, PC, PES, PAR, PI, PET, PEN, and PEEK.

16. The soft memristor of claim 15, wherein the size of metal filaments formed in a filament-type soft memristor is controlled by the metal diffusion barrier layer.

17. The soft memristor of claim 15, wherein the soft memristor has symmetric synaptic characteristics in response to a pulse voltage applied for synaptic potentiation and depression due to the metal diffusion barrier layer as a voltage divider.

18. The soft memristor of claim 15, wherein the first electrode layer is formed of a material selected from the group consisting of Cu, Ni, Ti, Hf, Zr, ZN, W, Co, V, Al, and Pt.

19. The soft memristor of claim 15, wherein the second electrode layer is formed of a material selected from the group consisting of Cu, Ni, Ti, Hf, Zr, ZN, W, Co, V, Al, and Pt.

20. The soft memristor of claim 15, wherein each of the first electrode layer and the second electrode layer is formed as a plurality of bars.

* * * * *